United States Patent
Tsai et al.

[11] Patent Number: 6,093,601
[45] Date of Patent: Jul. 25, 2000

[54] METHOD OF FABRICATING CROWN CAPACITOR BY USING OXYNITRIDE MASK

[75] Inventors: Hsin-Chuan Tsai; Yinan Chen, both of Taipei, Taiwan

[73] Assignee: Nanya Technology Corporation, Taoyuan, Taiwan

[21] Appl. No.: 09/167,491

[22] Filed: Oct. 7, 1998

[30] Foreign Application Priority Data

Aug. 14, 1998 [TW] Taiwan .................................. 87113391

[51] Int. Cl.⁷ ................. H01L 21/8242; H01L 21/8234; H01L 21/20
[52] U.S. Cl. .......................... 438/253; 438/238; 438/240; 438/255; 438/381; 438/397; 438/398; 438/396; 438/386; 438/634
[58] Field of Search ...................... 438/253, 238, 438/240, 255, 381, 397, 398, 396, 386, 634

[56] References Cited

U.S. PATENT DOCUMENTS

| | | |
|---|---|---|
| 5,849,619 | 12/1998 | Cho et al. ................................. 438/254 |
| 5,909,621 | 6/1999 | Hsia ......................................... 438/254 |
| 5,966,609 | 10/1999 | Kwon ....................................... 438/396 |
| 5,981,336 | 11/1999 | Chern ....................................... 438/253 |
| 5,994,181 | 11/1999 | Hsieh et al. ............................. 438/239 |

*Primary Examiner*—Brian Dutton
*Assistant Examiner*—Brook Kebede
*Attorney, Agent, or Firm*—Bacon & Thomas

[57] ABSTRACT

A method of fabricating a stack crown capacitor of a dynamic random access memory (DRAM) cell by using an oxynitride mask is disclosed. First, a dielectric layer and a silicon nitride layer are sequentially deposited over a substrate with an electrical device. Next, forming a contact in the silicon nitride layer and the dielectric layer, and depositing a first polysilicon layer to fill the contact. Next, depositing an oxide layer and an oxynitride layer sequentially, and then defining a bottom electrode pattern for etching the oxynitride layer and the oxide layer. Then, laterally etching the oxide layer, and depositing a second polysilicon layer. Next, etching the second polysilicon layer and the first polysilicon layer by using the oxynitride layer as a mask to form the bottom electrode. Next, removing the oxynitride layer, the oxide layer and partial silicon nitride layer. Finally, forming an interelectrode dielectric layer and a top electrode.

22 Claims, 3 Drawing Sheets

METHOD OF FABRICATING CROWN CAPACITOR BY USING OXYNITRIDE MASK

BACKGROUND OF THE INVENTION

1. Field of the Invention

The present invention relates to a method of fabricating a stack capacitor of a dynamic random access memory (DRAM) cell, and more particularly to a fabrication of a stack crown capacitor by using an oxynitride mask.

2. Description of the Prior Art

A DRAM cell comprises a metal-oxide-semiconductor field effect transistor (MOSFET) and a capacitor that are built in a semiconductor silicon substrate. There is an electrical contact between the drain of a MOSFET and the storage node of the adjacent capacitor, forming a memory cell of the DRAM device. A large number of memory cells make up the cell arrays which combine with the peripheral circuit to produce DRAMs.

In recent years, the sizes of the MOSFETs and capacitors have become continuously smaller so that the packing densities of these DRAM devices have increased considerably. For example, a number of semiconductor manufacturing companies in the world have already begun mass production of 64 Mbit DRAMs. These high density DRAMs offer the advantages of longer refresh time as well as less power consumption. However, as the sizes of the capacitors become smaller, so as the capacitance values of the capacitors are decreasing, that reduces the signal to noise ratio of the DRAM circuits, causing the performance problem. The issue of maintaining or even increasing the surface area of the storage nodes or reducing the thickness of the dielectric layer is particularly important as the density of the DRAM arrays continues to increase for future generations of memory devices.

There are two ways to deal with this problem: increasing the thickness of the bottom electrodes or increasing the surface area of the capacitors. Since increasing the thickness of the bottom electrodes is very difficult for precision lithography and etching control, increasing the capacitor surface area becomes an easier approach when the capacitor is used to fabricate 16 Mbit DRAMs and beyond. Various shapes of capacitor structures have been used to address this issue. U.S. Pat. No. 5,185,282 to Lee et al. of Hyundai Electronics (the entire disclosure of which is herein incorporated by reference) provides a method of fabricating cup-shaped capacitor storage node. Another U.S. Pat. No. 5,021,357 to Taguchi et al. of Fujisu (the entire disclosure of which is herein incorporated by reference) discloses a method of fabricating fin structure capacitor electrode. U.S. Pat. No. 5,021,357 to Choi et al. of Samsung (the entire disclosure of which is herein incorporated by reference) provides a method of fabricating cylinder-shaped (or crown-shaped) capacitor structure. These capacitor structures can effectively increase the capacitance values of the capacitors, however, these processes are too complicated and highly fastidious. They are difficult to be practically employed for DRAM mass-production.

The conventional DRAM process needs at least two masks to form the bottom electrode of a crown capacitor. It makes the DRAM process complication and increases the cost of the process. Moreover, the step of etching makes the surface of the bottom electrode rough, which may induce the leakage current problem caused by point discharge from the rough surface topology. In order to avoid this problem, the planarization of the bottom electrode of the crown capacitor is usually achieved by the high-cost method of Chemical Mechanical Polishing (CMP), which increases the cost of DRAM process too. Therefore, this invention provides a new crown capacitor process to solved said problems.

SUMMARY OF THE INVENTION

According, it is a primary object of the present invention to provide a method of fabricating a stack crown capacitor by using an oxynitride mask to save a photo step for forming the bottom electrode of the capacitor.

It is another object of the present invention to provide a method of fabricating a stack crown capacitor by using an oxynitride mask to form a planarized top surface of the bottom electrode for avoiding the problem of current leakage.

These objects are accomplished by the fabrication process described below.

First, MOSFETs structure which include gate oxide, gate electrodes and drain/source regions are formed on a semiconductor silicon substrate. Next, a dielectric layer and a silicon nitride layer are sequentially deposited over the entire silicon substrate. The silicon nitride layer and the dielectric layer are then partially etched to open drain contact windows. Next, a first polysilicon layer is deposited to fill into the contact windows. Next, an oxide layer and an oxynitride layer are deposited sequentially over the first polysilicon layer. Next, a photoresist pattern is defined on the oxynitride layer for making the bottom electrode of a crown capacitor, and then the oxynitride layer and the oxide layer are partially etched.

Next, the oxide layer is laterally etched, and a second polysilicon layer is deposited around the surface of the wafer. Next, anisotropically etching the second polysilicon layer and the first polysilicon layer by using the oxynitride layer as a mask for forming the bottom electrode. Next, the oxynitride layer, the oxide layer and a portion of silicon nitride layer are removed. Finally, a capacitor dielectric layer and a top electrode is formed sequentially by standard integrated circuit processing procedure. The stack crown capacitors of DRAM cells according to the present invention is accomplished.

BRIEF DESCRIPTION OF THE DRAWINGS

The accompanying drawings forming a material part of this description, in which:

FIG. 1 is a cross sectional representation of the DRAM cell after the cell contact windows of the MOSFET, the first polysilicon layer, the oxide layer and the oxynitride layer are formed, and the bottom electrode of the capacitor is patterned.

FIG. 2 is a cross sectional representation of the DRAM cell of FIG. 1 after the oxynitride layer and the oxide layer are etched, and than the oxide layer is laterally etched.

FIG. 3 is a cross sectional representation of the DRAM cell of FIG. 2 after the second polysilicon layer is deposited.

FIG. 4 is a cross sectional representation of the DRAM cell of FIG. 3 after the first and second polysilicon layers are etched, and than the bottom electrode is formed.

FIG. 5 is a cross sectional representation of the DRAM cell of FIG. 4 after the oxynitride layer, the oxide layer and the partial silicon nitride layer are removed.

FIG. 6 is a cross sectional representation of the DRAM cell of FIG. 5 after the crown capacitor is completely formed.

DETAILED DESCRIPTION OF THE PREFERRED EMBODIMENT

Figure 1:
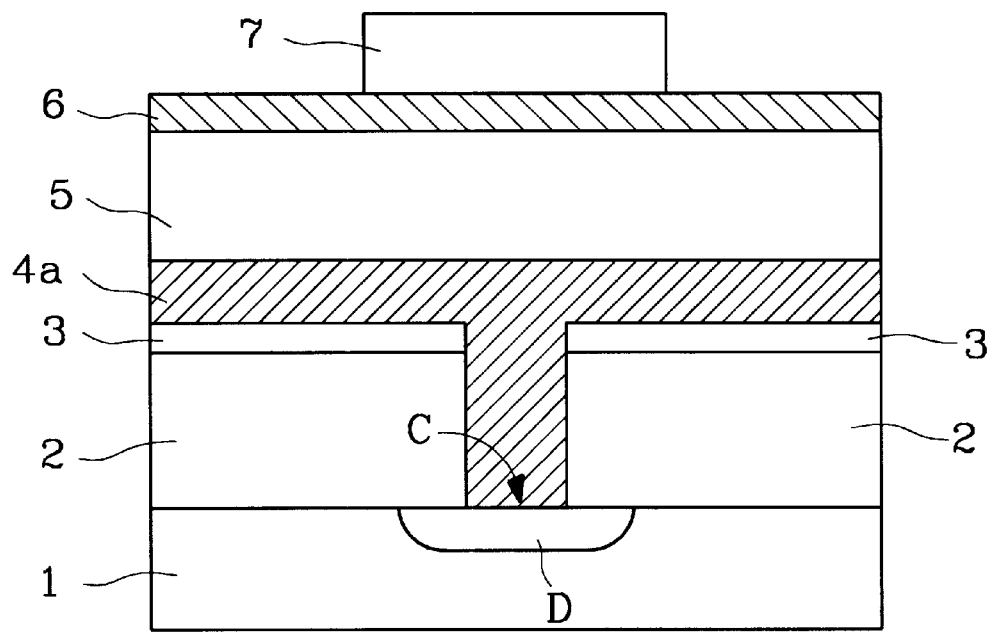
FIGS. 1 through 6 show schematic cross-sectional views of a partially fabricated integrated circuit structure at successive stages in forming a crown capacitor of a DRAM cell according to an embodiment of the present invention.

The invention disclosed herein is directed to a method of fabricating the stack crown capacitors of DRAMs. The drawing figures are illustrated a partially completed integrated circuit device. In the following description, numerous details are set forth in order to provide a thorough understanding of the present invention. It will be appreciated by ones skilled in the art that variations of these specific details are possible while still achieving the results of the present invention. In other instance, well-known processing steps are not described in detail in order not unnecessarily to obscure the present invention.

Referring now more particularly to FIG. 1, there is shown a portion of partially completed Metal-Oxide-Semiconductor Field Effect Transistor (MOSFET). A MOSFET region is usually consist of a gate oxide, gate electrode, pad oxide, lightly doped region, spacers, source and drain. For simplicity reason, FIG. 1 only shows the drain region of a MOSFET which is fabricated on a P-type semiconductor silicon substrate 1. The drain region D of the MOSFET which is formed by ion implantation technique, is preferably doped with arsenic ($As^{75}$) or phosphorus ($P^{31}$) ions, with an implantation dose of 2E15 to 5E16 $cm^{-2}$, and an implantation energy of 30 to 80 keV.

Referring to FIG. 1 again, the dielectric 2 and silicon nitride 3 layers are continuously deposited on the silicon substrate 1. The dielectric layer 2 is usually using boron-phosphosilicate glass (BPSG) which is formed by atmosphere CVD (APCVD) technique under the following condition: the temperature is about 400° C., and pressure is about 1.0 torr, with reactant gases of $Si(C_2H_5O)_4$, $N_2$ and TMB (Tri-Methyl-Borate). The thickness of the dielectric layer 2 is about 3000 to 8000 Angstroms. Thereafter, the dielectric layer 2 is planarized by thermal reflow, etchback or chemical mechanical polishing (CMP) techniques. The silicon nitride layer 3 which serves as polysilicon etch stopper is usually formed by LPCVD technique under the following conditions: the pressure is between 200 to 400 mTorr, with a temperature of about 720° C. to a thickness of between 200 to 600 Angstroms.

Still Referring to FIG . 1, the dielectric 2 and silicon nitride 3 layers are partially etched to open cell contact window C for the drain D of the MOSFET by the conventional lithography and plasma-etching techniques. The plasma etching process can use magnetic enhanced reactive ion etching (MERIE), electron cyclotron etching (ECR) or reactive ion etching (RIE) methods with reactant gases such as $CF_4$, $CHF_3$ and Ar. Next, the first polysilicon layer 4a which is overlaying the silicon nitride layer 3 and filling into the cell contact window C is deposited. The first polysilicon layer 4a is usually formed by in-situ phosphorus doped LPCVD method under a mixture of (15% $PH_3$+85% $SiH_4$) and (5% $PH_3$+95% $N_2$), at the temperature about 550° C. to obtain a thickness of between 1000 to 4000 Angstroms. Next, an oxide layer 5 and an oxynitride layer 6 are formed sequentially overlying the first polysilicon layer 4a, wherein the oxide layer 5 is using BPSG which is described before, and the oxynitride layer 6 has a thickness between 200 to 1000 Angstroms. Then, a photoresist pattern 7 of the bottom electrodes of the crown capacitors is defined by conventional lithography technique on the oxynitride layer 6.

Figure 2:
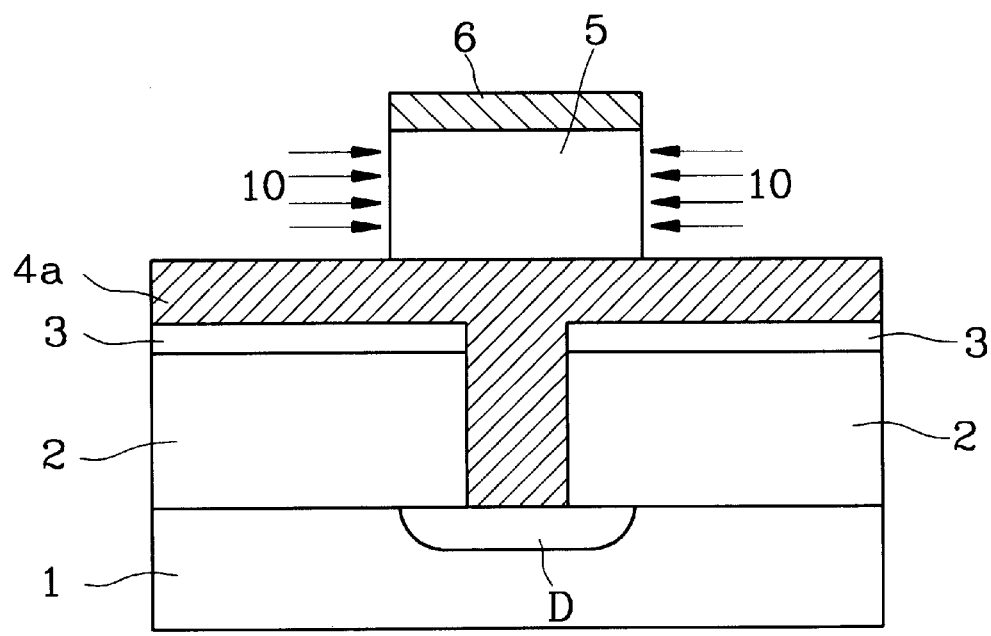

Referring now to FIG. 2, the oxynitride layer 6 and the oxide layer 5 are partially removed by vertical anisotropic etching with photoresist 7 as a mask. Then, the oxide layer 5 is laterally etched for removing its side wall about 700 to 1200 Angstroms by the method of wet etching with dilute hydrofluoric acid (DHF) of less than 1% concentration. In the process of the lateral etching, the etching rate of the oxide layer 5 has to be larger than the etching rate of the oxynitride layer 6, hereby the etching selectivity is between 4:1 to 10:1. That is the reason of using BPSG as the oxide layer 5.

Figure 3:
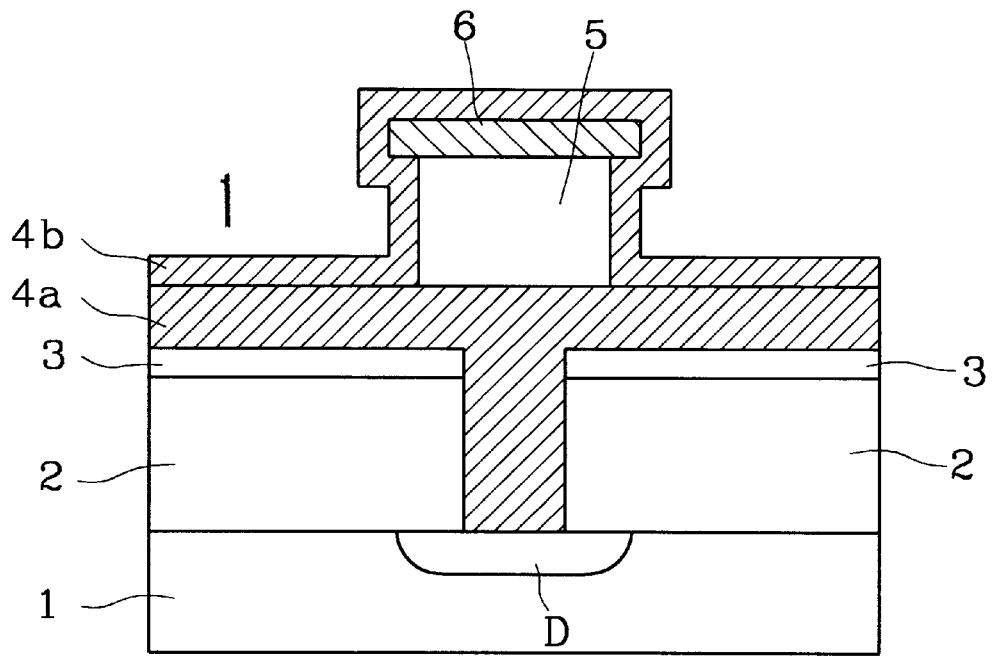
Figure 4:
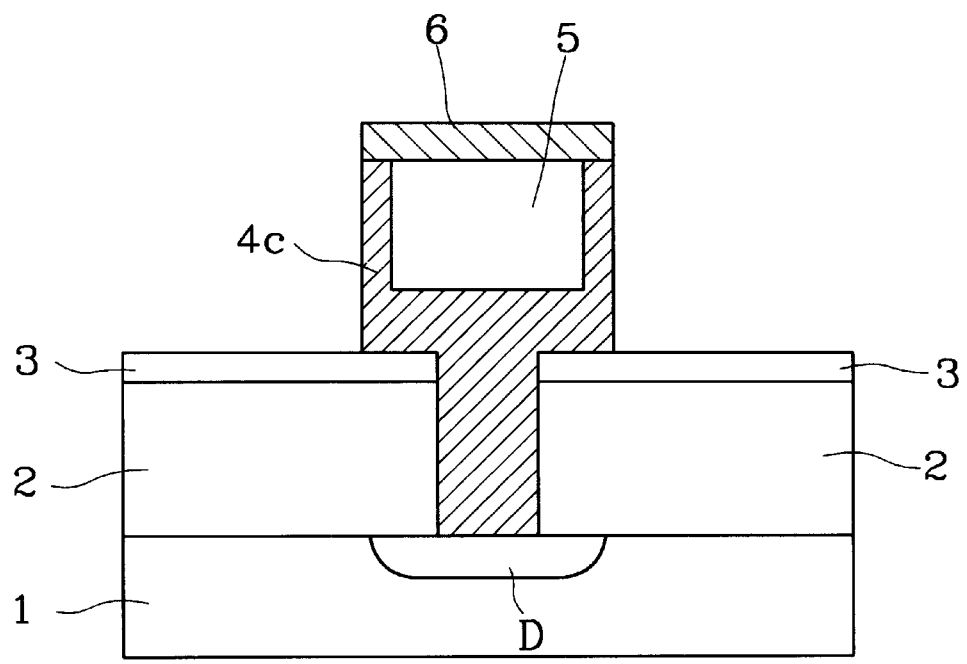

Referring now to FIG. 3, a second polysilicon layer 4b is deposited around the surface of the substrate. The second polysilicon layer 4b, as the first polysilicon layer 4a, is formed by in-situ phosphorus doped LPCVD method at the temperature about 550° C. to obtain a thickness of between 600 to 1500 Angstroms. Next, the second polysilicon 4b and the first polysilicon 4a layers are anisotropically etched by plasma-etching technique which can still use MERIE method with reactant gases such as $Cl_2$, $SF_6$ and HBr. Then, Referring to FIG. 4, the structure of the bottom electrodes 4c of crown capacitors are obtained.

Figure 5:
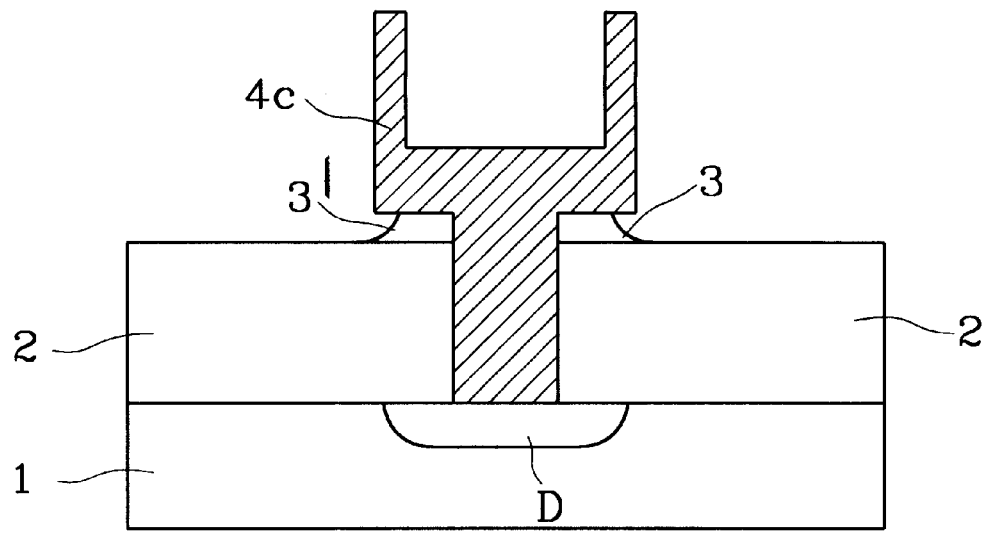

Referring now to FIG. 5, the oxynitride layer 6 and the oxide layer 5 is removed by a method of wet etching with hydrofluoric acid (HF). And, a portion of the silicon nitride layer 3 is removed by a method of wet etching with phosphoric acid ($H_3PO_4$). The residue of the silicon nitride layer 3 as a bolster can support the all structure of the crown capacitor.

Figure 6:
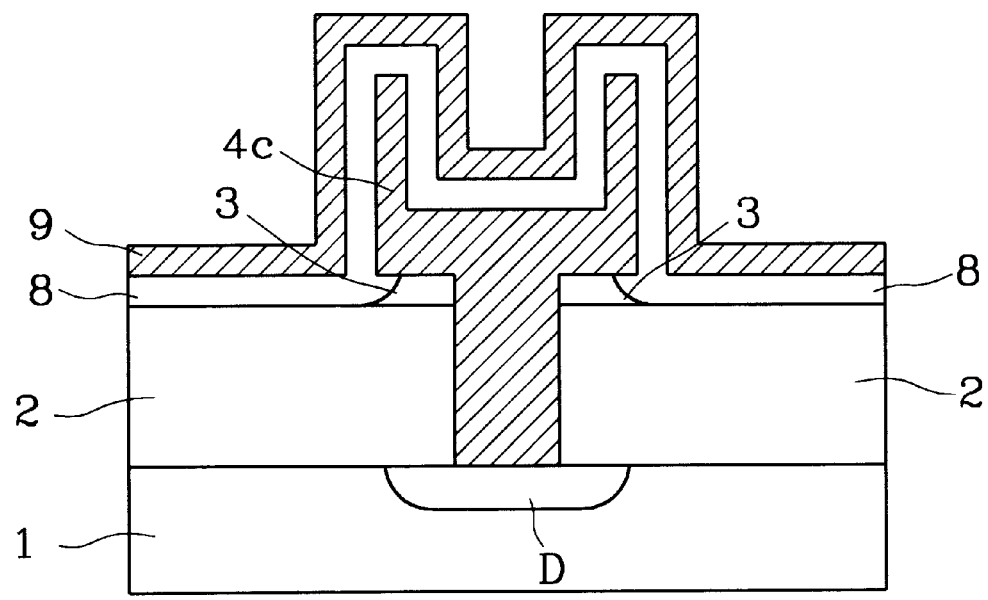

Finally, referring to FIG. 6, an interelectrode dielectric layer 8 and a third polysilicon layer 9 as top electrodes of the capacitors are sequentially formed by standard integrated circuit processing procedure. The stack crown capacitor for DRAM applications according to the present invention is accomplished.

The stack crown capacitor structure fabricated according to the present invention can save a photo step from the conventional process by using the oxynitride layer 6 as an etching mask. Furthermore, the oxynitride layer 6 covers the top end of the bottom electrodes 4c (referring to FIG. 4) which can avoid a rough surface of the top end from following etching step to easily solve the leakage current problem by point discharge from the rough surface without high-cost CMP planarization process used in the conventional process. Therefore, the stack crown capacitor fabricated according to the present invention can save a photo step of the process as well as planarize the surface of the top end of the bottom electrodes to make the cost down which are more suitable for high density DRAM applications.

It is to be understood that although the present invention has been described with reference to a particular preferred embodiment, it should be appreciated that numerous modifications, variations and adaptations may be made without departing from the scope of the invention as defined in the claims.

What is claimed is:

1. A method of fabricating a crown capacitor, comprising:
   (a) providing a semiconductor substrate with preformed electrical devices;
   (b) forming a dielectric layer and a silicon nitride layer overlying said substrate;
   (c) etching said silicon nitride layer and said dielectric layer to open a contact connecting to said electrical devices;
   (d) depositing a first polysilicon layer to fill said contact and cover the surface of said silicon nitride layer;

(e) sequentially depositing an oxide layer and an oxynitride layer overlying said first polysilicon layer;

(f) defining a photoresist pattern on said oxynitride layer for making the bottom electrode of said crown capacitor, and etching said oxynitride layer and said oxide layer;

(g) laterally etching said oxide layer;

(h) depositing a second polysilicon layer around the surface of said semiconductor substrate;

(i) anisotropically etching said second polysilicon layer and said first polysilicon layer by using said oxynitride layer as a mask to form said bottom electrode;

(j) removing said oxynitride layer, said oxide layer and a portion of silicon nitride layer; and (k) forming a capacitor dielectric layer overlying said bottom electrode and a top electrode overlying said capacitor dielectric layer.

2. The method as recited in claim 1, wherein said oxynitride layer has a thickness of 200 to 1000 Angstroms.

3. The method as recited in claim 1, wherein said second polysilicon layer has a thickness of 600 to 1500 Angstroms.

4. The method as recited in claim 1, wherein said lateral etching of step (g) removes a thickness of 700 to 1200 Angstroms from the side wall of said oxide layer.

5. The method as recited in claim 1, wherein in the process of said lateral etching of step (g), the etching rate of said oxide layer is faster than the etching rate of said oxynitride layer in which the etching selectivity is between 4:1 to 10:1.

6. The method as recited in claim 1, wherein said oxide layer is BPSG.

7. The method as recited in claim 1, wherein said anisotropic etching of step (i) is anisotropic plasma etching.

8. The method as recited in claim 1, wherein said removing said oxynitride layer and said oxide layer is performed by wet etching.

9. The method as recited in claim 8, wherein said wet etching is using hydrofluoric acid (HF).

10. The method as recited in claim 1, wherein said removing a portion of said silicon nitride layer of step (j) is performed by wet etching.

11. The method as recited in claim 10, wherein said wet etching is using phosphoric acid ($H_3PO_4$).

12. A method of fabricating a crown capacitor of a dynamic random access memory (DRAM) cell, comprising:

(a) forming a MOSFET structure on a silicon substrate, wherein said MOSFET comprises of a gate oxide layer, a gate electrode and drain/source regions;

(b) forming a dielectric layer and a silicon nitride layer overlying said substrate;

(c) etching said silicon nitride layer and said dielectric layer to open a contact connecting to said source/drain regions;

(d) depositing a first polysilicon layer to fill said contact and cover the surface of said silicon nitride layer;

(e) sequentially depositing an oxide layer and an oxynitride layer overlying said first polysilicon layer;

(f) defining a photoresist pattern on said oxynitride layer for making the bottom electrode of said crown capacitor, and etching said oxynitride layer and said oxide layer;

(g) laterally etching said oxide layer;

(h) depositing a second polysilicon layer around the surface of said semiconductor substrate;

(i) anisotropically etching said second polysilicon layer and said first polysilicon layer by using said oxynitride layer as a mask to form said bottom electrode;

(j) removing said oxynitride layer, said oxide layer and a portion of silicon nitride layer; and (k) forming a capacitor dielectric layer overlying said bottom electrode and a top electrode overlying said capacitor dielectric layer.

13. The method as recited in claim 12, wherein said oxynitride layer has a thickness of 200 to 1000 Angstroms.

14. The method as recited in claim 12, wherein said second polysilicon layer has a thickness of 600 to 1500 Angstroms.

15. The method as recited in claim 12, wherein said lateral etching of step (g) removes a thickness of 700 to 1200 Angstroms from the side wall of said oxide layer.

16. The method as recited in claim 12, wherein in the process of said lateral etching of step (g), the etching rate of said oxide layer is faster than the etching rate of said oxynitride layer in which the etching selectivity is between 4:1 to 10:1.

17. The method as recited in claim 12, wherein said oxide layer is BPSG.

18. The method as recited in claim 12, wherein said anisotropic etching of step (i) is anisotropic plasma etching.

19. The method as recited in claim 12, wherein said removing said oxynitride layer and said oxide layer is performed by wet etching.

20. The method as recited in claim 19, wherein said wet etching is using hydrofluoric acid (HF).

21. The method as recited in claim 12, wherein said removing a portion of said silicon nitride layer of step (j) is performed by wet etching.

22. The method as recited in claim 21, wherein said wet etching is using phosphoric acid ($H_3PO_4$).

* * * * *